(12) United States Patent
Charest et al.

(10) Patent No.: US 11,058,221 B2
(45) Date of Patent: *Jul. 13, 2021

(54) SYSTEMS AND METHODS FOR DAMPING A STORAGE SYSTEM

(71) Applicant: Cisco Technology, Inc., San Jose, CA (US)

(72) Inventors: Glenn Patrick Charest, San Jose, CA (US); Daniel Bernard Hruska, San Carlos, CA (US); Aditya Prabhakar, San Mateo, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 970 days.

This patent is subject to a terminal disclaimer.

(21) Appl. No.: 15/678,876

(22) Filed: Aug. 16, 2017

(65) Prior Publication Data

US 2017/0340113 A1 Nov. 30, 2017

Related U.S. Application Data

(63) Continuation of application No. 14/621,246, filed on Feb. 12, 2015, now Pat. No. 9,763,518.

(Continued)

(51) Int. Cl.
*A47B 88/473* (2017.01)
*A47B 88/433* (2017.01)
(Continued)

(52) U.S. Cl.
CPC .......... *A47B 88/473* (2017.01); *A47B 88/433* (2017.01); *A47B 88/483* (2017.01);
(Continued)

(58) Field of Classification Search
CPC ... A47B 88/473; A47B 88/433; A47B 88/483; A47B 88/53; G11B 33/08; G11B 33/128; H05K 7/1421
(Continued)

(56) References Cited

U.S. PATENT DOCUMENTS 4,688,695 A 8/1987 Hirohata
5,690,194 A 11/1997 Parker et al.
(Continued)

FOREIGN PATENT DOCUMENTS

| EP | 2680155 | 1/2014 |
|---|---|---|
| TW | 1566104 | 1/2017 |
| WO | WO 2016/003408 | 1/2016 |

OTHER PUBLICATIONS

Stamey, John, et al., "Client-Side Dynamic Metadata in Web 2.0," SIGDOC '07, Oct. 22-24, 2007, pp. 155-161.
(Continued)

*Primary Examiner* — Eret C McNichols
*Assistant Examiner* — Michael McDuffie
(74) *Attorney, Agent, or Firm* — Polsinelli PC

(57) ABSTRACT

In an embodiment, an apparatus (e.g., for damping a motion of a drawer in a storage system) comprises a plate to pivotally attach to a first wall of a drawer, the plate comprising a pivot point about which the plate can pivot; a damped gear coupled to the plate, the damped gear having a plurality of gear teeth; and a spring to facilitate pivoting the plate about the pivot point to engage at least one of the plurality of gear teeth with at least one tooth on a rack. In some embodiments, the spring is to pivot the plate from a first configuration to an angular position relative the wall in a second configuration, wherein the at least one of the plurality of gear teeth and the at least one tooth on the rack (Continued)

are fully engaged with one another in both the first configuration and the second configuration.

20 Claims, 10 Drawing Sheets

Related U.S. Application Data

(60) Provisional application No. 62/043,985, filed on Aug. 29, 2014.

(51) Int. Cl.
| | |
|---|---|
| *G11B 33/08* | (2006.01) |
| *G11B 33/12* | (2006.01) |
| *H05K 7/14* | (2006.01) |
| *A47B 88/483* | (2017.01) |
| *A47B 88/53* | (2017.01) |

(52) U.S. Cl.
CPC .............. *A47B 88/53* (2017.01); *G11B 33/08* (2013.01); *G11B 33/128* (2013.01); *H05K 7/1421* (2013.01)

(58) Field of Classification Search
USPC .. 248/298.1, 292.12, 292.13, 241, 242, 243, 248/244; 312/319.1, 331, 333
See application file for complete search history.

(56) References Cited

U.S. PATENT DOCUMENTS

| | | | |
|---|---|---|---|
| 6,043,777 A | 3/2000 | Bergman et al. | |
| 6,715,007 B1 | 3/2004 | Williams et al. | |
| 6,848,759 B2 | 2/2005 | Doornbos et al. | |
| 7,051,056 B2 | 5/2006 | Rodriguez-Rivera et al. | |
| 7,108,339 B2 | 9/2006 | Berger | |
| 7,174,354 B2 | 2/2007 | Andreasson | |
| 7,359,321 B1 | 4/2008 | Sindhu et al. | |
| 7,403,987 B1 | 7/2008 | Marinelli et al. | |
| 7,434,105 B1 | 10/2008 | Rodriguez-Rivera et al. | |
| 7,487,321 B2 | 2/2009 | Muthiah et al. | |
| 7,512,744 B2 | 3/2009 | Banga et al. | |
| 7,631,023 B1 | 12/2009 | Kaiser et al. | |
| 7,654,625 B2 | 2/2010 | Amann et al. | |
| 7,716,648 B2 | 5/2010 | Vaidyanathan et al. | |
| 7,752,360 B2 | 7/2010 | Galles | |
| 8,205,951 B2 | 6/2012 | Boks | |
| 8,210,623 B2* | 7/2012 | Chen ...................... | A47B 88/49 312/331 |
| 8,266,238 B2 | 9/2012 | Zimmer et al. | |
| 8,272,104 B2 | 9/2012 | Chen | |
| 8,297,722 B2 | 10/2012 | Chambers et al. | |
| 8,605,431 B2* | 12/2013 | Cheng ................... | F16M 11/10 361/679.56 |
| 8,668,286 B2* | 3/2014 | Gasser ................... | A47B 88/40 312/331 |
| 8,668,287 B2* | 3/2014 | Schwarzmann ....... | A47B 88/49 312/331 |
| 8,714,670 B2* | 5/2014 | Kuo ...................... | H05K 7/1489 312/223.1 |
| 8,898,385 B2 | 11/2014 | Jayaraman et al. | |
| 8,918,586 B1 | 12/2014 | Todd et al. | |
| 8,925,696 B2* | 1/2015 | Zeilenga ................ | F16F 1/10 188/290 |
| 8,960,820 B2* | 2/2015 | Chen ...................... | A47B 88/40 312/331 |
| 9,207,929 B2 | 12/2015 | Katsura | |
| 9,582,377 B1 | 2/2017 | Dhoolam et al. | |
| 9,763,518 B2* | 9/2017 | Charest ................. | A47B 88/53 |
| 2003/0131165 A1 | 7/2003 | Asano et al. | |
| 2003/0189395 A1 | 10/2003 | Doornbos | |
| 2004/0128540 A1 | 7/2004 | Roskind | |
| 2004/0190901 A1 | 9/2004 | Fang | |
| 2005/0114611 A1 | 5/2005 | Durham et al. | |
| 2005/0169188 A1 | 8/2005 | Cometto et al. | |
| 2005/0198523 A1 | 9/2005 | Shanbhag et al. | |
| 2006/0017358 A1* | 1/2006 | Sato ...................... | A47B 88/47 312/333 |
| 2006/0045021 A1 | 3/2006 | Deragon et al. | |
| 2006/0075191 A1 | 4/2006 | Lolayekar et al. | |
| 2006/0098672 A1 | 5/2006 | Schzukin et al. | |
| 2006/0242332 A1 | 10/2006 | Johnsen et al. | |
| 2007/0091903 A1 | 4/2007 | Atkinson | |
| 2007/0258380 A1 | 11/2007 | Chamdani et al. | |
| 2007/0283059 A1 | 12/2007 | Ho et al. | |
| 2008/0126509 A1 | 5/2008 | Subrannanian et al. | |
| 2008/0288661 A1 | 11/2008 | Galles | |
| 2009/0236487 A1* | 9/2009 | Shi ....................... | A61B 6/0457 248/424 |
| 2011/0161496 A1 | 6/2011 | Nicklin | |
| 2011/0228679 A1 | 9/2011 | Varma et al. | |
| 2011/0255540 A1 | 10/2011 | Mizrahi et al. | |
| 2012/0030401 A1 | 2/2012 | Cowan et al. | |
| 2012/0075999 A1 | 3/2012 | Ko et al. | |
| 2012/0159112 A1 | 6/2012 | Tokusho et al. | |
| 2012/0201138 A1 | 8/2012 | Yu et al. | |
| 2012/0257501 A1 | 10/2012 | Kucharczyk | |
| 2013/0016850 A1* | 1/2013 | Huh ....................... | B60R 11/02 381/86 |
| 2013/0067162 A1 | 3/2013 | Jayaraman et al. | |
| 2013/0086340 A1 | 4/2013 | Fleming et al. | |
| 2013/0223236 A1 | 8/2013 | Dickey | |
| 2014/0021843 A1* | 1/2014 | Hashemi ............. | E05B 47/0001 312/333 |
| 2014/0059266 A1 | 2/2014 | Ben-Michael et al. | |
| 2014/0095556 A1 | 4/2014 | Lee et al. | |
| 2014/0164666 A1 | 6/2014 | Yand | |
| 2014/0189278 A1 | 7/2014 | Peng | |
| 2014/0265783 A1* | 9/2014 | Hauer ................... | A47B 88/483 312/331 |
| 2014/0376550 A1 | 12/2014 | Khan et al. | |
| 2015/0092824 A1 | 4/2015 | Wicker, Jr. et al. | |
| 2015/0142840 A1 | 5/2015 | Baldwin et al. | |
| 2015/0169313 A1 | 6/2015 | Katsura | |
| 2015/0277804 A1 | 10/2015 | Arnold et al. | |
| 2015/0374125 A1* | 12/2015 | Goetz ................... | A47B 88/467 312/319.1 |
| 2016/0004611 A1 | 1/2016 | Lakshman et al. | |
| 2016/0014918 A1* | 1/2016 | Kelaher ............... | H05K 7/1487 312/319.1 |
| 2016/0054922 A1 | 2/2016 | Awasthi et al. | |
| 2016/0058188 A1* | 3/2016 | Charest ................ | H05K 7/1421 248/636 |
| 2016/0119421 A1 | 4/2016 | Semke et al. | |
| 2016/0139820 A1 | 5/2016 | Fluman et al. | |
| 2016/0149639 A1 | 5/2016 | Pham et al. | |
| 2016/0174707 A1* | 6/2016 | Chan ..................... | E05C 17/02 312/333 |
| 2016/0231928 A1 | 8/2016 | Lewis et al. | |
| 2016/0294983 A1 | 10/2016 | Kliteynik et al. | |
| 2016/0319582 A1* | 11/2016 | Grabher ............... | A47B 88/473 |
| 2016/0366094 A1 | 12/2016 | Mason et al. | |
| 2016/0380694 A1 | 12/2016 | Guduru | |
| 2017/0068630 A1 | 3/2017 | Iskandar et al. | |
| 2017/0212858 A1 | 7/2017 | Chu et al. | |
| 2017/0273019 A1 | 9/2017 | Park et al. | |
| 2017/0277655 A1 | 9/2017 | Das et al. | |
| 2017/0280872 A1* | 10/2017 | Chen ..................... | A47B 88/46 |
| 2018/0097707 A1 | 4/2018 | Wright et al. | |

OTHER PUBLICATIONS

Aweya, James, et al., "Multi-level active queue management with dynamic thresholds," Elsevier, Computer Communications 25 (2002) pp. 756-771.

Petersen, Chris, "Introducing Lightning: A flexible NVMe JBOF," Mar. 9, 2016, 6 pages.

\* cited by examiner

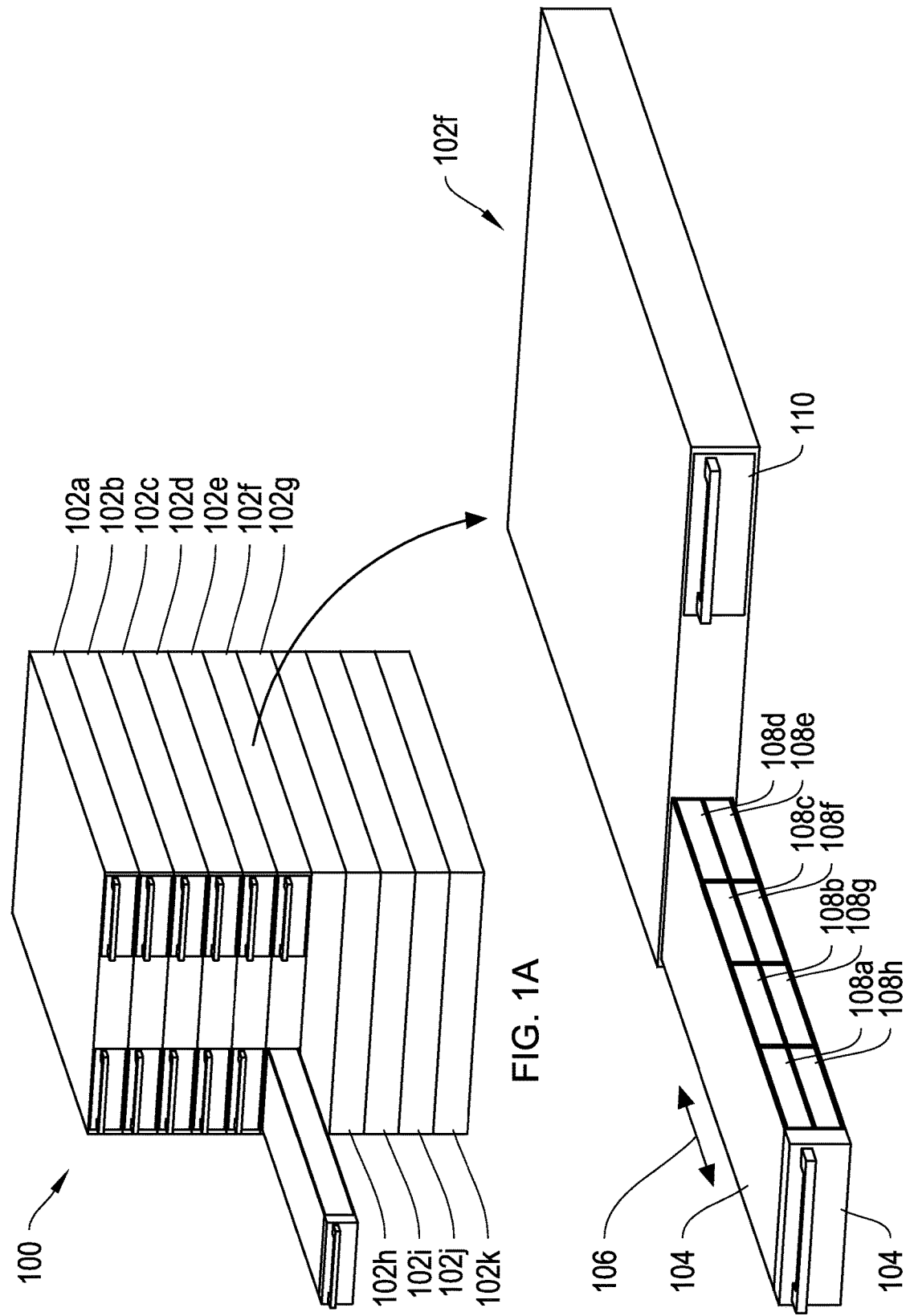

SYSTEMS AND METHODS FOR DAMPING A STORAGE SYSTEM

CROSS-REFERENCE TO RELATED APPLICATION

This application is a continuation of U.S. patent application Ser. No. 14/621,246 filed on Feb. 12, 2015, which is now U.S. Pat. No. 9,763,518, and which claims the benefit of priority to U.S. Provisional Application Ser. No. 62/043,985, filed Aug. 29, 2014, the contents of which are incorporated by reference in their entirety.

TECHNICAL FIELD

This disclosure relates in general to the field of motion damping equipment and, more particularly, to equipment providing damping in a storage system for moving electrical components.

BACKGROUND

Many electrical components (e.g., hard disks, laboratory equipment, etc.) are sensitive to mechanical motions (e.g., vibration, acceleration, deceleration, impact, etc.) and may be damaged by rapid motion. However, many modern electrical components (e.g., storage disks) include moving parts that can remain operable (e.g., rotating, spinning, oscillating etc.) while the component is subjected to motion. For example, when repairing or replacing a storage disk in a server rack, any rapid motion introduced to the disk (or adjacent disks, each of which may be spinning at 10,000 revolutions per minute or more) may permanently damage the disk and cause loss of critical data. There is a need for better systems to manage the motion of electrical components, especially those electrical components that contain moving parts that can remain operable while the component is subject to one or more mechanical motions.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 1A and 1B are simplified three-dimensional isometric views of a storage system according to an embodiment of the present disclosure;

DESCRIPTION OF EXAMPLE EMBODIMENTS OF THE DISCLOSURE

Overview

Figure 2A:
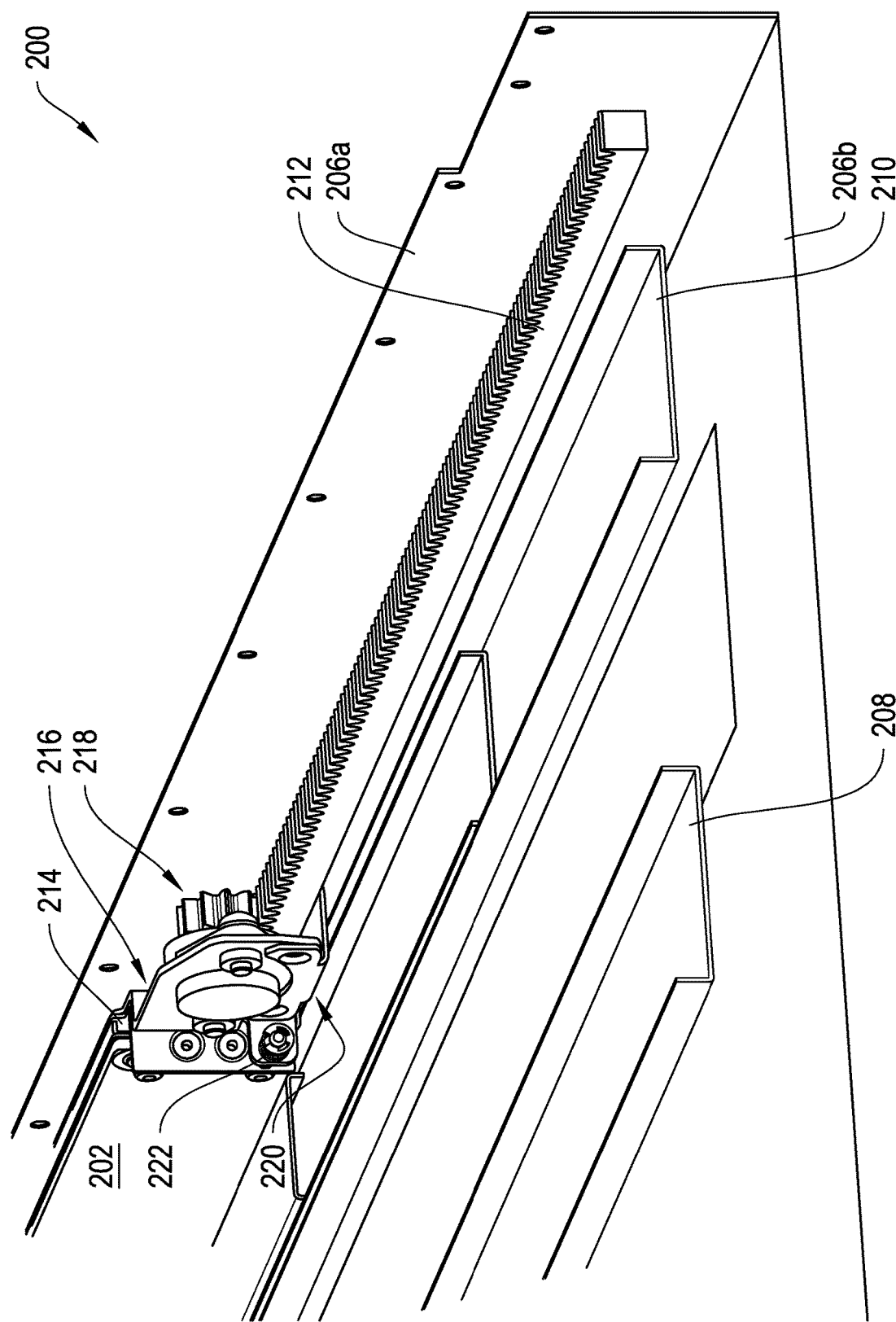
FIGS. 2A, 2B and 2C are simplified three-dimensional isometric views of an embodiment of a damping apparatus according to an embodiment of the present disclosure.

In some embodiments, an apparatus for damping the motion of a drawer in a storage system is provided, the apparatus comprises: a plate to pivotally attach to a first wall of a drawer, the plate comprising a pivot point about which the plate can pivot; a damped gear coupled to the plate, the damped gear having a plurality of gear teeth; and a spring to facilitate pivoting the plate about the pivot point to engage at least one of the plurality of gear teeth with at least one tooth on a rack.

In other embodiments, an apparatus can comprise: a plate to pivotally attach to a first wall of a drawer, the plate comprising a pivot point about which the plate can pivot; a damped gear coupled to the plate, the damped gear having a plurality of gear teeth; and a spring coupled to the plate, wherein the spring is to pivot the plate, about the pivot point, from a first configuration to an angular position relative the wall in a second configuration, and wherein at least one of the plurality of gear teeth and at least one tooth on a rack are fully engaged with one another in both the first configuration and the second configuration. In some embodiments the damped gear comprises a gear coupled to a damper that damps rotational movement of the gear.

In other embodiments, an method can comprise: providing a damper system comprising a damped gear having gear teeth for pivotally engraving teeth in a rack; and receiving, by damper system, a motion that moves the gear teeth relative to the teeth in the rack, wherein the engagement between the teeth in the rack and the gear teeth is maintained during the motion based on at least one of a spring for pivoting the damped gear and a retention bracket retaining the rack.

EXAMPLE EMBODIMENTS

FIGS. 1A and 1B are simplified three-dimensional isometric views of a storage system according to an embodiment of the present disclosure. FIG. 1A illustrates storage system 100, which is a storage rack for storing a plurality of electrical components. Storage rack 100 includes storage shelves 102a-102k. Each of storage shelves 102a-102k includes two drawers for storing a portion of the plurality of electrical components (or any other components). FIG. 1B illustrates storage shelf 102f, which includes drawers 104 and 110. Drawer 104 includes a plurality of electrical storage disks 108a-h. Each of electrical storage disks 108a-h may be a spinning disk for storing digital information (e.g., a disk hard drive). The disks (or any spinning storage media, or rapidly moving and/or oscillating devices) are sensitive to external vibration and rapid acceleration (or rapid deceleration).

In the example shown in FIG. 1B, drawer 104 is shown withdrawn (i.e., in a fully extended position) from the storage shelf 102f; drawer 110 is shown inserted (i.e., in a fully inserted position) into the storage shelf 102f. Each drawer may be moved from the fully extended position to the fully inserted position or vice versa. The drawers may be slidably moved in a direction perpendicular to the face of the rack (e.g., as shown by arrows on axis 106) during withdrawal from and/or insertion into the storage shelf. For example, the drawers may slide in and out of a main chassis (within the storage shelf).

Because each of the electrical components (e.g., the electrical storage disks 108a-h such as hotplug-able server blades and/or any hot swappable device) includes moving components that are operable while the drawer is opened or closed), the sliding motion (e.g., along axis 106) of the drawer has the potential to cause physical damage to the electrical components. In addition, vibrations (e.g., perpendicular to axis 106) introduced while withdrawing or inserting the drawer may also cause physical damage to the electrical components (in this case disks). For example, when servicing (e.g., repairing, replacing, etc.) any of the disks, the drawer could be opened with extreme force or at a fast rate (i.e., high speed, acceleration, and/or deceleration) and, thereby, cause physical damage to the moving components (and/or components of the drawer itself). In one example, the physical damage may be due, at least in part, to inertial forces exerted by rapidly sliding the drawer closed and bringing it to a sudden stop at a point when the drawer is fully inserted such as "slamming" the drawer shut. While a disk hard drive is used in this example, the systems and methods described herein are equally applicable to any component with moving parts and/or that is sensitive to physical movements (e.g., sudden or fast movements) and could be physically damaged by such a movement (e.g., telescopes, microscopes, laboratory equipment, and the like).

Systems and methods disclosed herein provide damping in a storage system for storing moving electrical components. For example, such systems and methods help to: reduce the likelihood of introducing vibrations and/or rapid movements (e.g., high acceleration, high deceleration, impact loads) to a drawer that is supporting storage devices; reduce the likelihood of damage to the drawer (e.g., damage to drawer rails for supporting the electrical components and/or damage to electrical components housed within the storage drawer) during service; and/or impart a "smooth" motion during extension and retraction of the drawer (e.g., by controlling the rate at which the drawer can be extended and retracted by damping respective motions). In one example, the drawer(s) may slide in and/or out of a main chassis, which includes a rack (e.g., a rack with teeth) running along one or more sides of the chassis. The drawer is coupled to a damper (e.g., via a damped gear on the damper) and a retention bracket. During a movement of the drawer (e.g., while the drawer is being pulled out from or pushed into the storage shelf), the damper resists the movement thereby reducing a speed (and/or velocity) at which the drawer can be moved and reducing the likelihood of physical damage to the drawer (and/or the components therein or coupled thereto). In one example, a damped gear provides motion resistance (e.g., via damping) through a motion of the storage drawer (e.g., regardless of whether the drawer is being withdrawn (opened) or inserted (closed)). The motion resistance (e.g., the damping) is to prevent physical damage to at least one of: one or more electrical component stored within the drawer, the rack, or a chassis on which the rack is located.

Figure 2B:
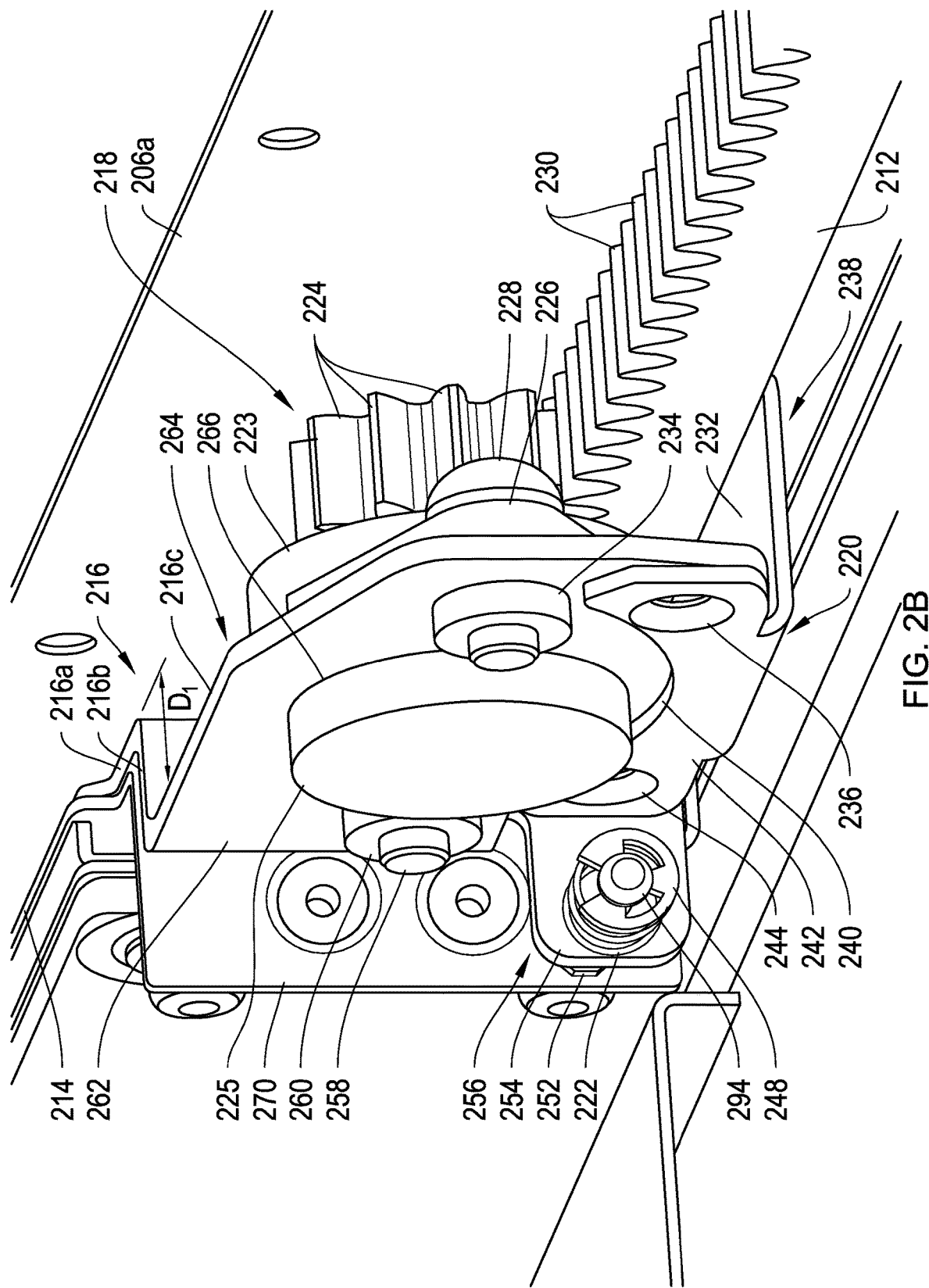
Figure 2C:
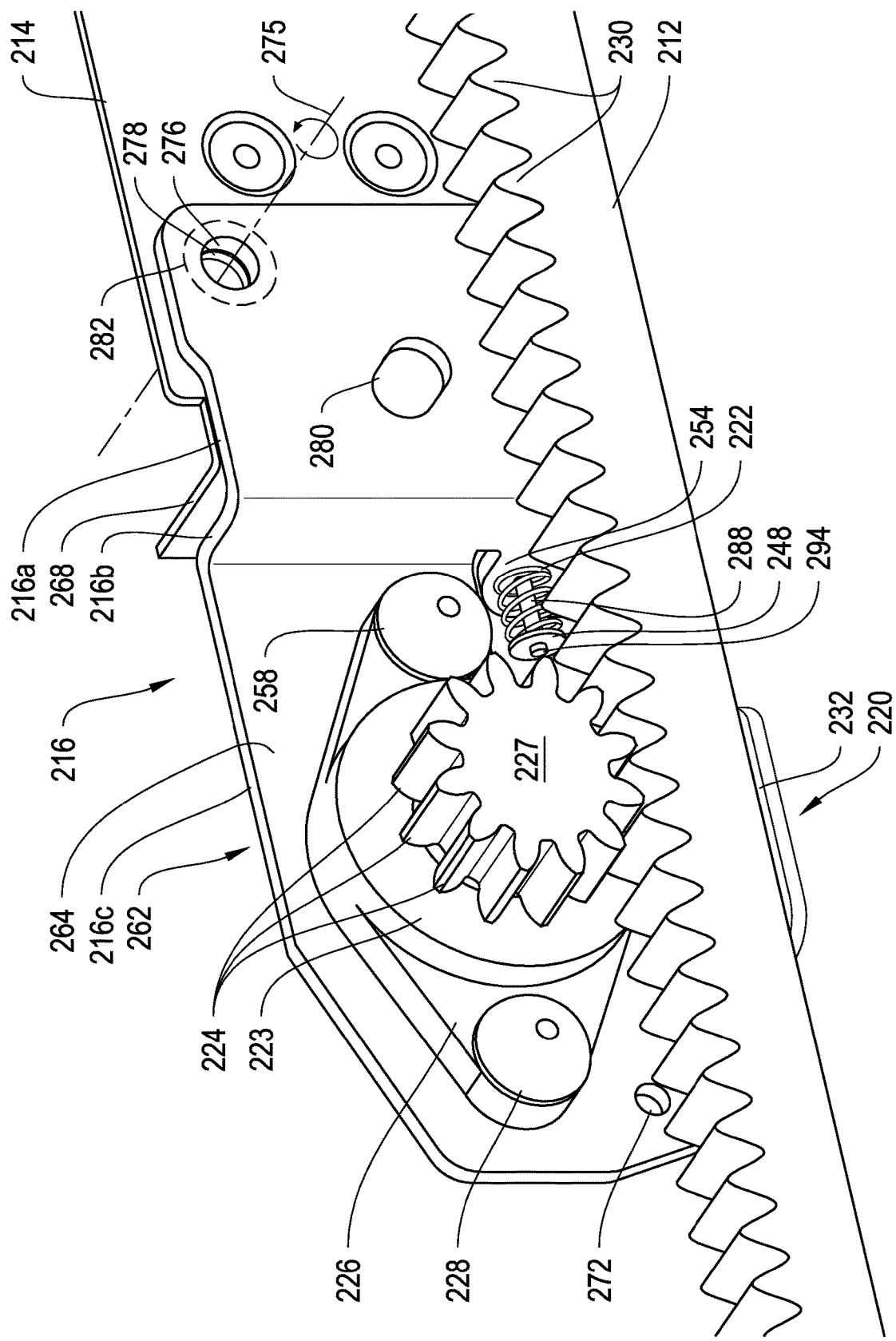

Turning to FIGS. 2A, 2B and 2C, FIGS. 2A, 2B and 2C are simplified three-dimensional isometric views of an embodiment of a damping apparatus (or system) according to an embodiment of the present disclosure. FIG. 2A illustrates one view of the damping apparatus in a configuration wherein a drawer to which the damping apparatus is attached is in a fully extended position (i.e., withdrawn). The damping apparatus (i.e., system 200) includes, among other things, a chassis 206 (i.e., 206a-b), a rack 212, ball bearing slides 210 and 208, a wall 214, a plate 216, a damper 218, a spring 222, a bracket 220, and electrical components 202. In this example, the electrical components 202 are a printed circuit assembly. However, other electrical components may be supported in other examples. The chassis 206 includes a vertical portion of the chassis 206a and a horizontal portion of the chassis 206b. The rack 212 is attached to the vertical portion 206a of the chassis 206 and runs parallel to a long dimension of the vertical portion 206a. The rack 212 is fixed with respect to vertical portion 206a. In some examples, the rack is attached with an attachment mechanism such as one or more of glue, a rivet, a screw, a nut and bolt assembly, and the like. The rack 212 includes a plurality of teeth operable to engage with another toothed member (e.g., a gear on the damper 218). A drawer assembly (e.g., comprising the wall 214, the ball bearing slides 208 and 210, the spring 222, the plate 216, and the damper 218) supports the electrical components. In particular, the wall 214, at least in part, supports the electrical components 202 (and/or other components stored in the drawer) by transferring a portion of the weight of the electrical components to the rack 212 via the damper 218. The wall 214 supports vertical forces (and/or movement) associated with the drawer assembly. Thus, any vertical movement of the drawer assembly (e.g., due to a user lifting up on or pushing down on the drawer assembly) causes a corresponding movement of the wall 214. In conventional systems, this vertical movement (or lift) can results in teeth in the damper disengaging from teeth in the rack. To address this issue (and other issues) the systems and apparatus disclosed herein provide mechanisms to maintain (at least partial) engagement between teeth in the damper and the teeth in the rack.

In addition, the ball bearing slides 208 and 210 may also support the electrical components. The wall 214 and the ball bearing slides 208 and 210 transfer forces (e.g., the weight of supported components, forces caused by movements and/or vibrations, and the like) to the rack 212 via the plate 216 and damper 218. The drawer assembly moves relative to the chassis 206. The ball bearing slides 210 and 208 guide horizontal movement of the drawer assembly (e.g., insertion into and/or withdrawal from the chassis). Any horizontal forces introduced to the ball bearing slides 210 and 208 results in the telescoping components of the ball bearing slides to telescope into (or out of) to one another. Because the ball bearings are coupled to the wall 214 (and therefore are also coupled to the damper 218), horizontal movement of the ball bearings may also cause the rotation of the damped gear on damper 218. Thus, the damper 218 may also (at least in part) damp the horizontal movement of the ball bearings.

The chassis 206 supports the electrical components. A wall 214 of the drawer is coupled to a plate 216. The plate 216 may be made from metal, plastic, or any suitably rigid material. The plate 216 is attached to the wall 214 by a hinge (e.g., a fastener that couples the plate to the wall and facilitates rotation of the plate relative the wall). The plate 216 supports a damper 218. The damper 218 includes a gear; the gear having a circular shape. Gear teeth are disposed about the circumference of the gear. When the gear receives a motion (and/or force) that rotates the gear (e.g., by the gear teeth), the damper 218 provides damping to the motion by, e.g., resisting the motion to slow the rate at which the motion increases in speed.

In an exemplary operation of the damping apparatus, the gear teeth of the damper 218 are used to apply damping to movement of a storage system. The damping can prevent physical damage to one or more electrical component stored within the storage system (e.g., due to high deceleration, high acceleration, or impact load). In some embodiments, the one or more electrical component comprises disk storage or a spinning storage media (e.g., server blades). The server blades may be stored in a storage rack comprising shelves, each having multiple drawers of spinning disks for digitally storing data (as often applied in server systems).

The damper 218 is attached to the plate 216 such that its position is fixed relative to the plate. In the configuration shown in FIG. 2A, spring 222 exerts a force (e.g., due to the spring being compressed) on a flange of the plate 216 causing and, thereby, introduces a torsion to the plate (about the hinge). Since the damper 218 is fixed with respect to the plate 216, rotation of the plate (by spring 222), causes rotation of the damper (about the axis) thereby engaging (e.g., interleaved) a portion of the teeth of the geared damper with a portion of the teeth in the rack 212. In this configuration, the portion of the teeth of the geared damper is fully engaged with the portion of the teeth in the rack 212. The rack 212 is fixed. However, the drawer (and/or or wall 214) may receive a vertical force (a force that moves the drawer up and/or down) causing the drawer (and/or or wall 214) to lift relative to the rack 212. As the drawer (and/or or wall 214) moves down relative to the rack, the spring 222 is further compressed and continues to exert a force on the plate 216 thereby pivoting the plate and damper upward to maintain engagement between the teeth of 218 and 212. As the drawer (and/or or wall 214) moves up relative to the rack, the spring 222 is elongated (but remains compressed relative to its free, uncompressed length) and continues to exert a force on the plate 216 thereby pivoting the plate and damper downward to maintain engagement between the teeth of 218 and 212. In addition, the retention bracket 220 prevents disengagement of the at least one of the plurality of gear teeth from the at least one tooth on the rack. For example, if a relative movement between the wall and the rack approach a point that would otherwise disengage the teeth, the retention bracket 220 retains the rack to maintain engagement between the teeth of 218 and 212. In another example, if the relative movement between the wall and the rack approach a point that would otherwise disengage the teeth, the retention bracket 220 retains the rack to maintain engagement between the teeth of 218 and 212. Thus, the drawer (e.g., via the rack) remains engaged with the damper so that the damper can protect one or more moving (oscillating, spinning, vibrating, etc.) electrical components within the drawer and/or storage system from physical damage by damping a motion of the system (e.g., during opening and/or closing of the system).

FIG. 2B illustrates a detail of the view of the damping apparatus in the configuration wherein the drawer to which the damping apparatus is attached is in a fully extended position. Plate 216 includes a first planar portion 216a, a second planar portion 216c, and a medial portion 216b. The first planar portion 216a and the second planar portion 216c are parallel to one another. The plate 216 has a first surface 262 and a second surface 264. The first surface 262 and the second surface 264 are on opposite sides of the plate. Each of the first surface 262 and the second surface 264 are continuous across planar portions 216-c. The first planar portion 216a is offset from the second planar portion 216c by a distance equal to D1 (e.g., measured between the second surface of each as illustrated in FIG. 2B). In some embodiments, the distance D1 is determined based on the depth of the damper 218 (e.g., the height of damper body portion 223 measured perpendicular to the face for 216c). The medial portion 216b is disposed between the first planar portion 216a and the second planar portion 216c. In addition, the medial portion 216b is perpendicular to both the first planar portion 216a and the second planar portion 216c. Plate 216 is pivotally attached to the wall 214 (e.g., a first wall) by a fastener assembly. The drawer includes at least two walls: the wall 214 and wall 270. The wall 270 (i.e., a second wall) is perpendicular to the wall 214 (i.e., the first wall). The plate has a pivot point (e.g., a hole in the plate and/or a center point of the hinge) about which the plate can pivot.

Damper 218 is coupled to the second planar portion 216c of plate 216. The damper 218 includes a gear 227 (also referred to herein as a "damped gear"). The term "damped gear" includes a gear for which the rotation of the gear about its counterpoint is damped. The damper 218 damps rotational movements of the gear 227. The gear 227 includes a plurality of gear teeth 224, which are disposed about the circumference of the gear. The second planar portion 216c includes three openings for attachment of the damper 218. Damper 218 is mechanically attached to planar portion 216c by bolts 228 and 258 and corresponding nuts 234 and 260, respectively which engage two of the three openings (not visible in this view) in the portion 216c for the damper 218. A body of the damper 218 comprises several connected portions (i.e., body portions 223, 225, and 226). Body portion 223 supports body portion 226. Body portion 223 and 225 are located on opposite sides of the plate 216. The body portion 225 extends through opening 266, which is a third opening of the three openings in the portion 216c. Together, the mechanical fasteners and the body portion 223 extending through the plate 216 retain the damper in a substantially fixed position with respect to the plate 216. In some embodiments, other suitable attachments for the damper may be utilized such as any of welding, bracing, riveting, gluing, fastening with a screw, fastening with a nut.

As can be seen in the detail of FIG. 2B, the rack 212 includes a plurality of teeth 230, which extend substantially the full length of the rack 212. The retention bracket 220 is attached to the plate (i.e., at portion 216c) to prevent disengagement of (e.g., at least one of) the plurality of gear teeth 224 from (e.g., at least one) the tooth 230 on the rack 212. The retention bracket 220 comprises vertical portion 242 and horizontal portion 238. The vertical portion 242 comprises holes 244 and 236 for attaching the retaining bracket to the second planar portion 216c. The second planar portion 216c includes holes 272 and 274 (e.g., for coupling fasteners), which correspond to holes 244 and 236, respectively. As described with respect to geared damper 218, the retaining bracket may be attached to plate 216 using any suitable attachment mechanism. In addition, the retention bracket 220 includes an arcuated surface 240 for maintain a clearance distance between the body 225 of geared damper 218 and the retention bracket 220. The horizontal portion 238 of retention bracket 220 includes a top surface 232 and a bottom surface (not visible in this view). In operation, top surface 232 contacts a bottom portion of rack 212 and, thereby, prevents disengagement of the gear teeth 224 from the teeth 230 on the rack.

The spring 222 facilitates pivoting the plate 216 about a pivot point (e.g., the hinge) to engage at least one of the gear teeth 224 with at least one tooth of the teeth 230 on the rack 212. In this example, the pivot point is a centerline axis of a fastener assembly 282. The medial portion supports a flange 254. The flange 254 is coplanar with the medial portion 216b. The flange 254, at least in part, supports the spring 222. The spring 222 is compressed between a face of the flange 254 and a retaining clip 248. The retaining clip 248 is supported, at least in part, by a pin 246. In particular the retaining clip 248 is supported at an end 294, which is distal the wall 270 and/or the flange 254. At least one side of the retaining clip 248 is a surface that retains spring in place (e.g., a retaining surface that is distal the face of the flange 254c). Because the pin 246 is in a fixed position relative to the wall 270, any force exerted by the spring 222 (due to the spring being compressed) on both the pin and flange 254 causes rotation of the plate 216 about the pivot point (which causes compression or extension of the spring). Movement of the flange (i.e., caused by lifting the drawer and/or axial compress), results in a moment (e.g., torsion) being generated in the plate 216 about the hinge. Since the hinge is designed to not resist moment forces (or to provide very little moment resistance), the plate rotates about the hinge. Because the axis about which the plate rotates is perpendicular to the axis in which the spring applies a force, the spring (e.g., a linear spring) advantageously causes rotation about the hinge to maintain contact between the gear teeth 224 and the teeth 230 on the rack 212. A gap 256 is located between the flange 254 and the wall 270. For example, if medial portion 216b were flush with (and/or in direct contact with) wall 270, the plate 216 would not be able to pivot about the hinge. The gap provides space needed for the plate to rotate and allows the plate to rotate without contacting the wall 270 (which would otherwise prevent the rotational movement needed for pivoting the pin). In addition, the gap provides a space for a head 252 of pin 246. The gap is large enough to provide a clearance distance between the head 252 and the flange 254.

Using the combination of the spring 222 and the retention bracket 220, the plate can be positioned in at least a first configuration and a second configuration. In the first configuration (e.g., as shown in FIGS. 2A, 2B, and 2C, 4A, 4C), the at least one of the plurality of gear teeth 224 are fully engaged with the at least one tooth (of the teeth 230) on rack based on the spring 222 pivoting the plate (e.g., forcing the plate to pivot about the hinge). In the second configuration (e.g., as shown in FIGS. 5A and 5B), the at least one of the plurality of gear teeth 224 are partially engaged with the at least one tooth 230 on the rack based on the retention bracket 238 contacting a surface of the rack 212.

FIG. 2C illustrates a detail of an alternate view of the damping apparatus in the configuration wherein the drawer to which the damping apparatus is attached is in a fully extended position. Opening 276 in plate 216 coincides with an opening 278 in wall 214). A hinge for the plate 216 can extend through both opening 276 and 278. Axis 275 is centered within the opening 276 and is the axis about which the plate 216 rotates. Because axis 275 is perpendicular to the axis in which the spring applies a force (i.e., an axis along the shaft of pin 246), the spring 222 (e.g., a linear spring) advantageously causes rotation of the plate 216 about the axis 274 to maintain contact between the gear teeth 224 (on the damped gear 227) the teeth 230 (on the rack 212).

In the example of FIG. 2C, the plate 216 includes a mechanism for limiting a range of rotation of the plate 216. In this example, the mechanism is an arcuated opening 280 in first planar portion 216a. The opening 280 receives a bearing member such as a bolt or pin to limit the pivotal motion of the plate 216. When secured to the wall 214 and extended through the opening 280, the bearing member will contact a boundary of the opening 280 at one or more limit of a range of pivotal motion thereby preventing pivoting beyond the one or more limit. The actuated opening 280 may be present in some examples but is excluded from other examples.

Figure 2D:
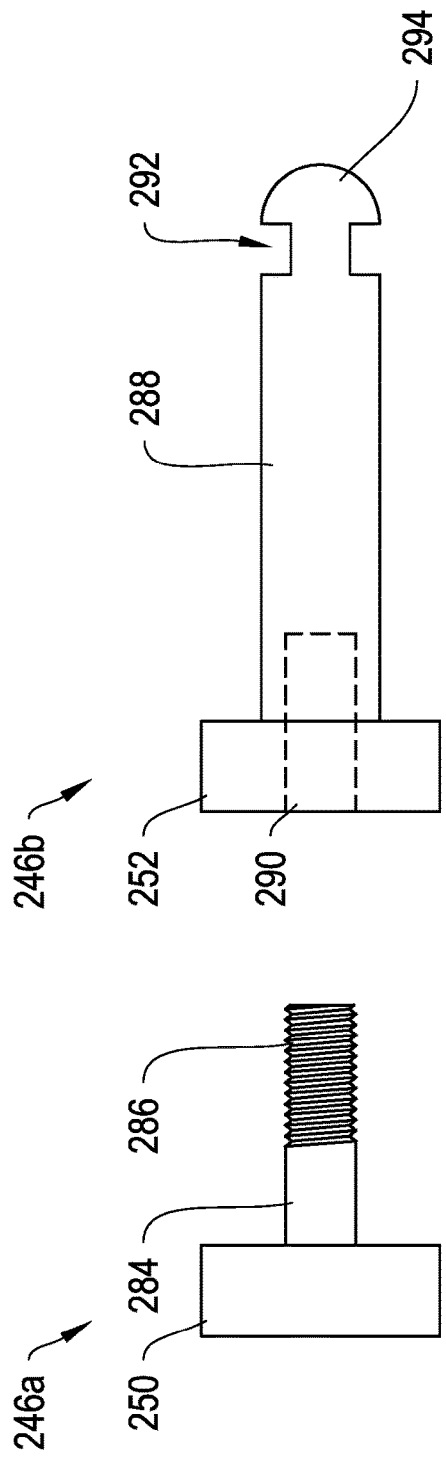
FIGS. 2D and 2E are simplified two-dimensional side views of a pin utilized in the embodiment of the damping apparatus of FIGS. 2A, 2B and 2C.
Figure 2E:
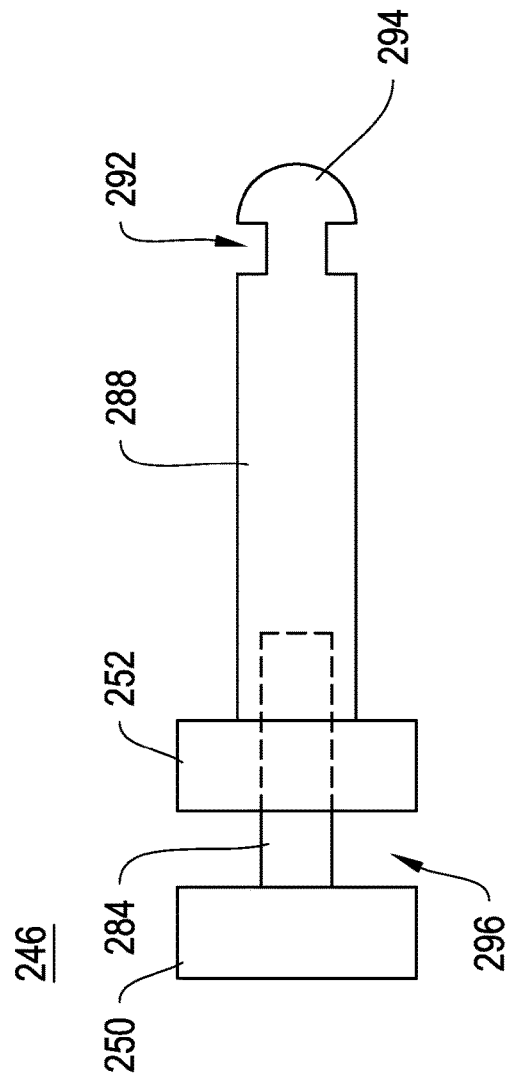

Turning to FIGS. 2D and 2E, FIGS. 2D and 2E are simplified two-dimensional side views of the pin 246 utilized in the embodiment of the damping apparatus of FIGS. 2A, 2B and 2C. In the example of FIGS. 2A, 2B and 2C, the pin 246 is coupled to wall 270 (i.e., the second wall) of the drawer and supports the spring 222 using the retaining clip 248. The pin 246 comprises a first portion 246a and a second portion 246b. FIG. 2D illustrates pin 246 in a configuration where the first portion 246a and the second portion 246b are not attached to one another. The first portion 246a comprises a head 250 and a shaft 284. The shaft 284 includes a threaded portion 286. The first portion 246a may be attached to a threaded hole by the threaded portion 286 (e.g., by screwing first portion into the threaded hole). The second portion 246b comprises a head 252, a shaft 288, a threaded hole 290, an end 294, and a groove 292. The head 252 is located at a first end of the shaft 288. End 294 corresponds to a second end of the shaft 288. The shaft 288 is cylindrical in shape. The groove 292 is recessed into the shaft and spans the entire circumference of the shaft. The groove 292 is for supporting the retaining clip 248 (e.g., the surfaces of the groove can retain the clip in place). The end 294 has a tapered shape. The tapered shape, among other things, facilitates placement of the retaining clip into the groove. In one example, the retaining clip is a partial disk (e.g., an e-clip) with a hole at the center of the disk. The hole in the retaining clip may be of a diameter that matches the diameter of the groove. In such an example, the tapered shape may facilitate gradually defecting (e.g., flexing the retaining clip to spread the arms of the retaining clip to fit around the end 294) to allow the retaining clip to be moved into the groove 292. When the retaining clip reaches the groove, the disk may unflex (or snap) and, thereby, come to rest in the groove 292 in an undeflected shape.

In operation, the first portion 246a and the second portion 246b are located on opposite sides of wall 270. The threaded hole 290 in the second portion 246b is aligned with a hole in wall 270. The threaded portion 286 is inserted through the hole in wall 270 and is screwed into the threaded hole 290 and, thereby, attaches the first portion 246a and the second portion 246b to one another about the wall 270. FIG. 2E illustrates pin 246 in a configuration where the first portion 246a and the second portion 246b are attached to one another. The pin includes a first end attached to the wall 270 of the drawer, a second end distal the first end, and a shaft disposed between the first end and the second end. The shaft extends through both an opening in the flange 254 and an opening in wall 270.

Figure 3:
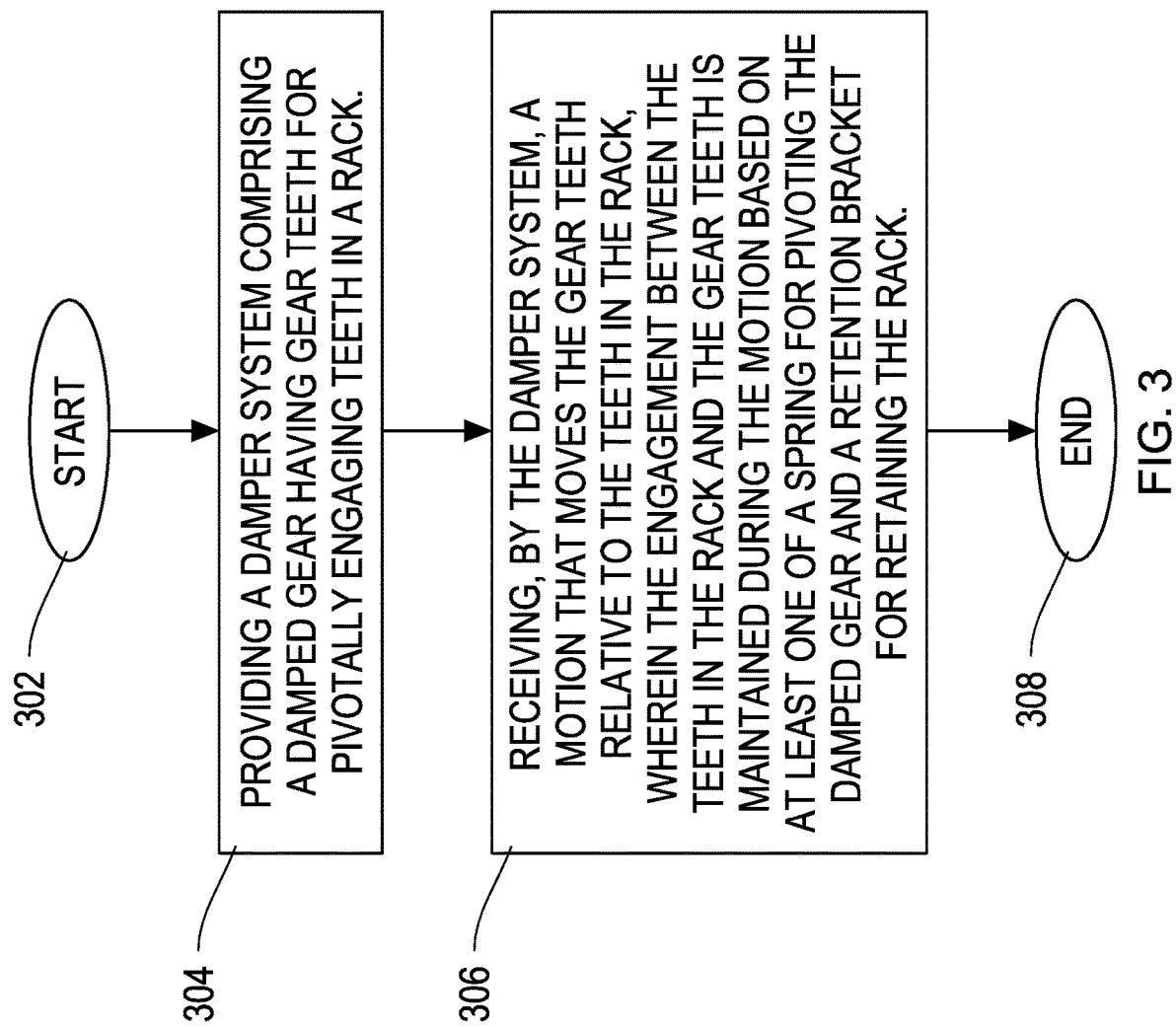
FIG. 3 is a simplified diagram of a method of utilizing a damping apparatus according to an embodiment of the present disclosure.

Turning to FIG. 3, FIG. 3 is a simplified diagram of a method of utilizing a damping apparatus according to an embodiment of the present disclosure. The method begins at a start point 302 and advances to procedure 304. At 304, a damping apparatus comprising a damped gear having gear teeth for pivotally engraving teeth in a rack is provided. The damping apparatus may be an apparatus or system according to the present disclosure (e.g., as described with respect to any one or more of the FIGS. 1A-1B, 2A-2E, 4A-4B, 5A-5B). The damped gear may be a gear having a plurality of gear teeth. As the gear is rotated about its center point, the rotation is damped. In one example, the damped gear is supported by a support structure, which pivots the gear into a position where the gear teeth can engage with the teeth in the rack. The rack may be a rectangular tubular element having a plurality of teeth disposed along the length of a surface. The rack may be coupled to a motion system such as a sliding door, drawer, rolling system, etc. that is coupled to a storage system for electrical components. At procedure 306, the damper system receives a motion that moves the gear teeth relative to the teeth in the rack, wherein the engagement between the teeth in the rack and the gear teeth is maintained during the motion based on at least one of: a spring for pivoting the damped gear, and/or a retention bracket retaining the rack. In one example, the motion can include the damper (and/or damped gear) sliding with respect to the rack (e.g., the rack is fixed and a drawer to which the damper gear is attached slides along the rack). The spring may apply a force (directly or indirectly) to the damped gear to facilitate the gear teeth interlocking (engaging) with the teeth in the rack. When the damper slides, the teeth in the rack engage with the gear teeth in the damped gear to rotate the damped gear about a center point of the gear and, thereby, damping the sliding motion. In another example, the motion can include the geared damper moving down (or up) with respect to rack. When the geared damper moves up (e.g., moving in a motion to attempt to lift the gear teeth away from the teeth in the rack), the retention bracket can make contact with the rack thereby preventing the gear teeth to from disengaging the teeth in the rack (and thus ensuring that the damping is not lost due to the gear teeth skipping over the teeth in the rack). The system can be subject to harsh or rapid movement (motion), which could have a negative impact on or damage the electrical components. In one example, components of a computing system are slidable with respect to one another. In this example, the components may be mounted on a rack with teeth that are engaged with teeth on corresponding damper systems. In such an example, any harsh or rapid sliding of one of the components could potentially cause damage to the other components in the computing system. Advantageously, this method maintains, at least partially, engagement between the gear teeth and the teeth in the rack regardless of relative position, angular orientation, slidable position (e.g., drawer opened or closed), by utilizes (1) the spring to force to the gear teeth and the teeth in the rack to interlock with one another, and/or (2) the retention bracket to limit and/or prevent relative displacement between the gear teeth and the teeth in the rack.

Figure 4A:
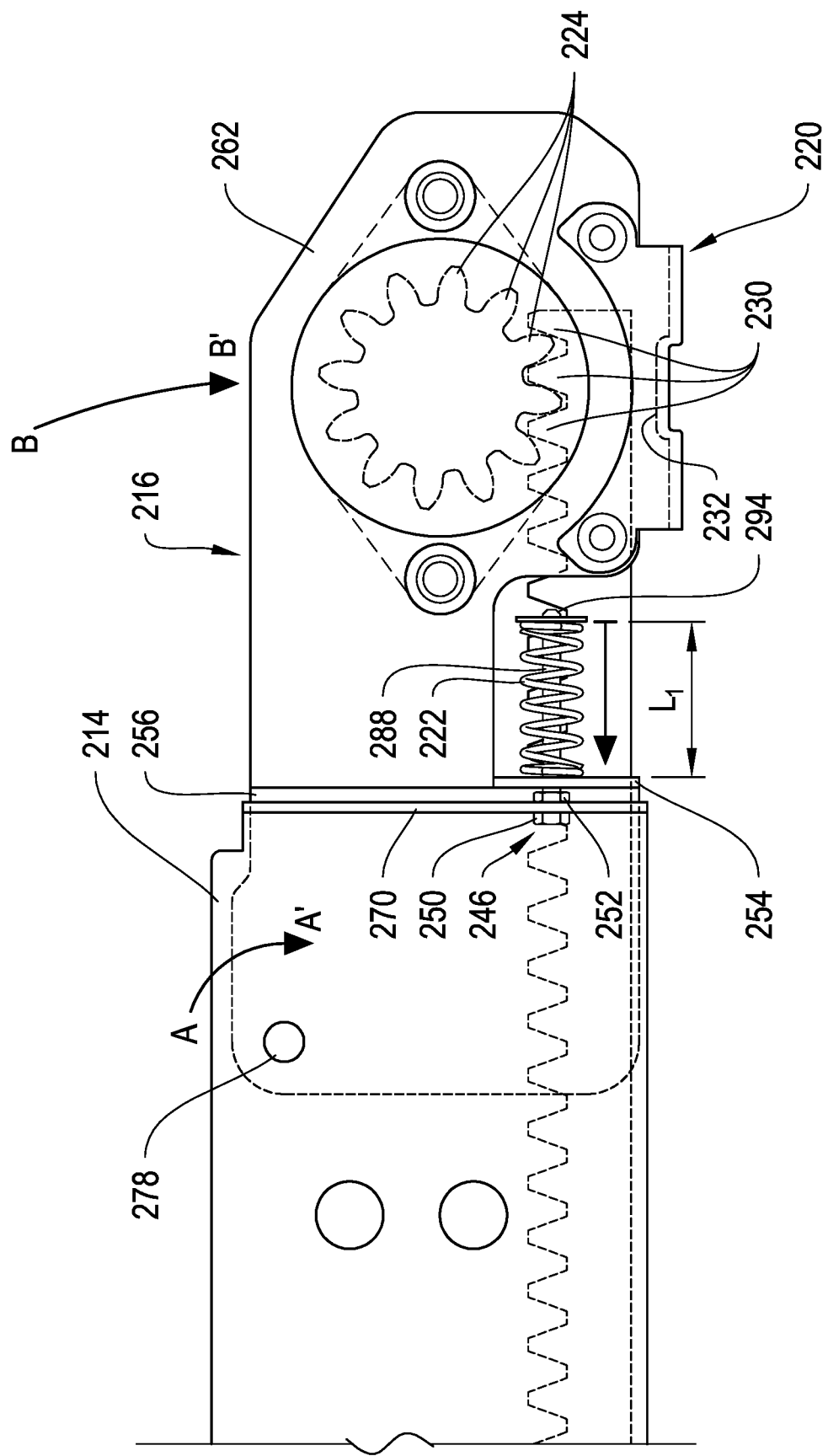
FIGS. 4A and 4B are simplified two-dimensional side views of an example configuration the damping apparatus.
Figure 4B:
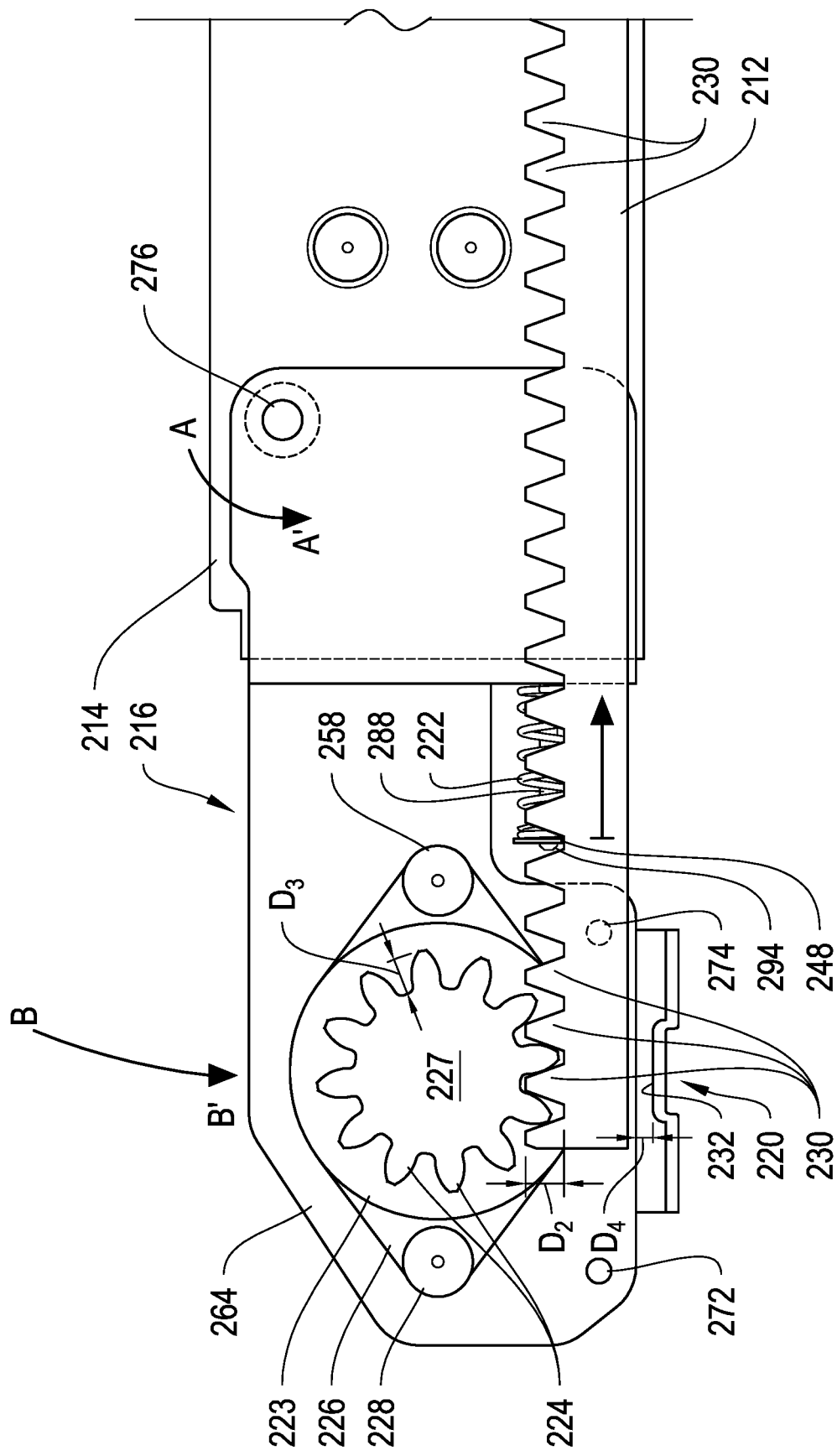
Figure 5A:
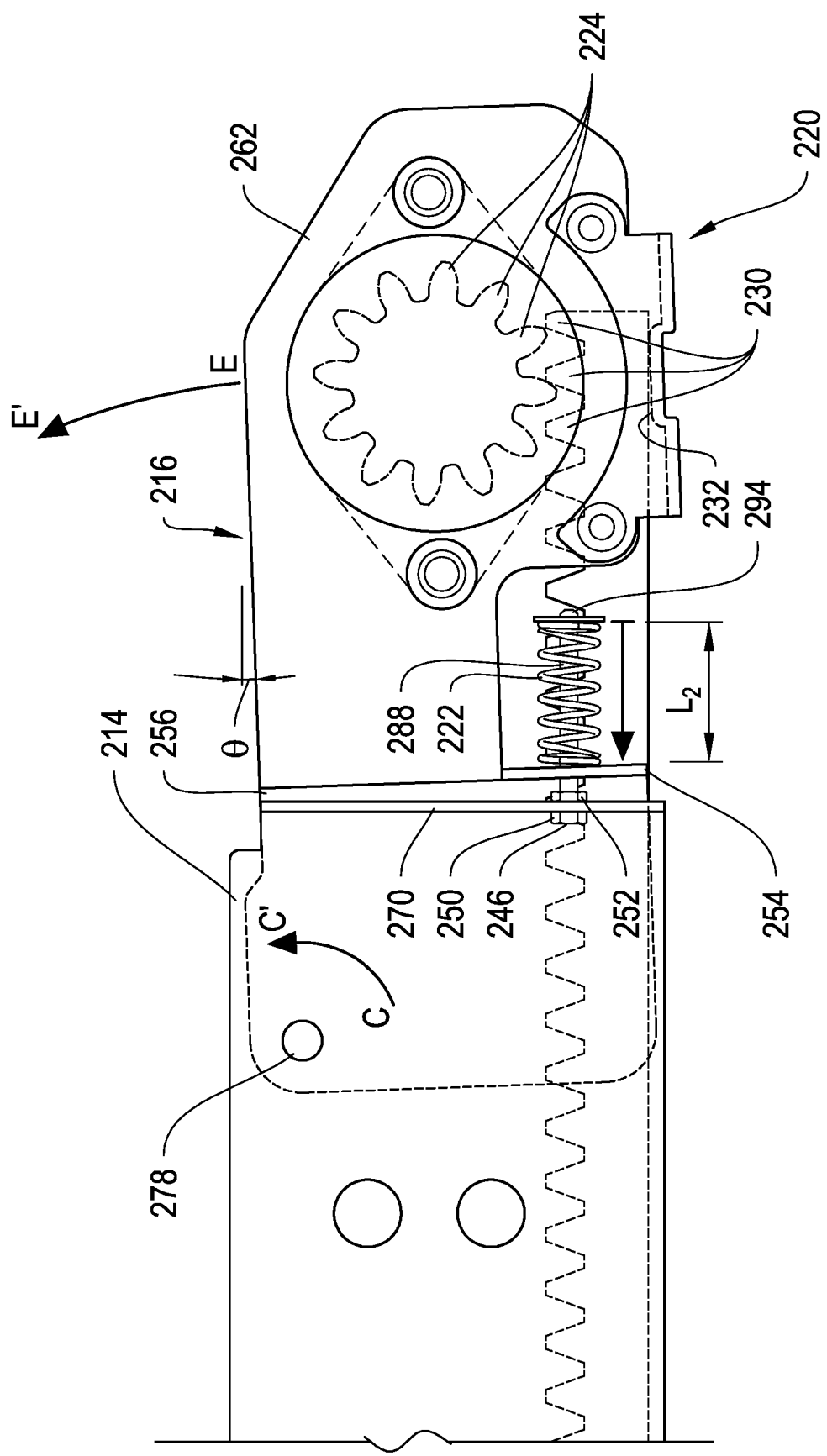
FIGS. 5A and 5B are simplified two-dimensional side views of another example configuration the damping apparatus.
Figure 5B:
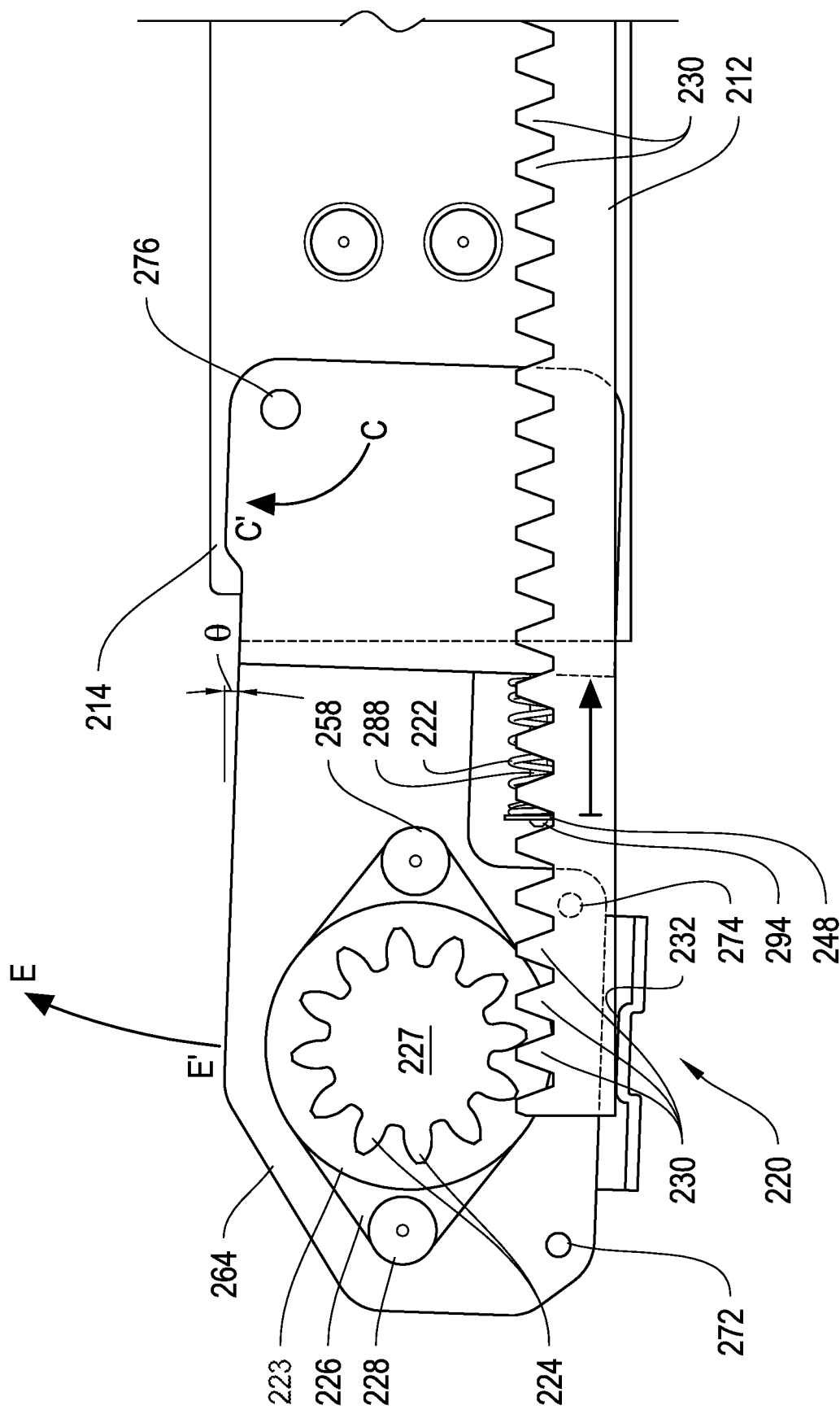

Turning to FIGS. 4A and 4B, FIGS. 4A and 4B are simplified three-dimensional isometric views of an example configuration the damping apparatus. Both FIGS. 4A and 4B show the plate 216 in a configuration (a first configuration) where at least one of the plurality of gear teeth 224 are fully engaged with the at least one tooth (of the teeth 230) on rack based on the spring 222 pivoting the plate (e.g., forcing the plate to pivot about the hinge). Turning now to FIG. 4A, FIG. 4A illustrates a view of the damping apparatus as viewed perpendicular to the first surface 262 of plate 216. In this example, spring 222 is compressed with respect to its free length. The free length, L0, of spring 222 is the length of the spring when it is not subject to any axial force (i.e. compression or tension). In FIG. 4A, the spring 222 is compressed to a length, L1, by the flange 254 and retaining clip 248. The compressed length, L1, is less than the free length, L0. Moreover, when disposed between flange 254 and retaining clip 248, the spring 222 remains compressed at all times. As the length of the spring changes (e.g., based on the plate 216 rotating), the spring may be more or less compressed but remains compressed with respect to the free length. In this example, the spring is applying a force as shown by the arrow in FIG. 4A. The spring 222 pushes against the retaining clip 248 and the flange 254 with equal force. The force applied to the retaining clip is transferred to the pin 246 at pin end 294. The pin 246 comprises components as described to with respect to FIGS. 2D and 2E. Pin portion 246a comprises a head 252, a second end 294, and a shaft 288. The shaft 288 is disposed between the head 252 and end 294. The spring 222 is disposed about the shaft 288 and exerts a spring force in an axis that lies along shaft 288 (e.g., the axis coincides with a centerline center of the shaft). The screw 246a couples to the head 252 to retain the pin 246 in a fixed position relative to the wall 270. When the pin is attached to the wall 270, the head 252 is located within the gap 256. Because the pin 246 is fixed with respect to wall 270, rotation of the plate 216 results in the flange 254 moving (due to the spring 222 applying a load on the flange) while the pin is stationary. In other words, the rotation of plate 216 and/or movement of the spring 222 does not substantially move the pin 246 and only moves the flange 254.

The entire plate 216 rotates about the hinge due to the spring 222 applying a force to flange 254. In this case the torsion caused by the spring results in a slight pivoting in a direction from A to A' about hole 278 in wall 214. Correspondingly, the spring causes the geared damper to pivot in a direction from B to B' about axis 275 thereby applying a downward force, which forces the gear teeth 224 of the damper 218 to move down into (e.g., in a interlocked or interleaved engagement with) the teeth 230 of the rack. The pivoting motion forces the teeth 224 of the gear 227 to interlock with the teeth 230 in rack 212.

In this case, the rack 212 is remains substantially horizontal (even under loading by spring 222) and is not rotated with respect to the wall and/or the plate. Because the teeth 224 and the teeth 230 are fully engaged with one another (e.g., interleaved with one another up to a maximum depth equal to the shorter of the teeth) the top surface 232 of retention bracket 220 is not in contact with the rack 212.

The teeth 224 remain at least partially engaged with the gear teeth 230 throughout a range of motion. For example, the plate 216 may pivot with respect to the rack 212. When the plate pivots, the spring remains in compression and, thereby, applies a torsional force to the plate that maintains at least partially engagement between the teeth 224 and the teeth 230. Thus, the spring 222 can pivot the plate about the pivot point (e.g., the hinge), from a first configuration at a first angular position relative the wall to a different angular position relative the wall in a second configuration. The spring facilitates the at least one of the plurality of gear teeth 224 and at least one tooth of the teeth 230 on a rack 212 being fully engaged with one another in both the first configuration and the second configuration. This may correspond to small movements in a drawer such as, e.g. a minor bouncing up (the first angular position) and down (the second angular position) while the drawer is opened or closed. At a third configuration, e.g., where the plate moves beyond an allowable range of motion for the plate, the at least one of the plurality of gear teeth remain partially engaged with the at least one tooth on the rack based on the retention bracket 220 contacting a surface of the rack 212. This may correspond to large movements in the drawer such as, e.g., a large vertical movement up while the drawer is opened or closed. Thus, teeth 224 and teeth 230 are always, at least partially, engaged with one another regardless of the relative position, angular orientation, slidable position (e.g., drawer opened or closed), etc.

Turning now to FIG. 4B, FIG. 4B illustrates an alternate view of the damping apparatus as viewed perpendicular to the second surface 264 of plate 216. The opening 276 in plate 216 is the point about which plate 216 rotates. Again, the gear teeth 224 on damper 227 are fully engaged with teeth 230 in racks 212. In this view, holes 272 and 274 are visible on surface 264. Holes 272 and 274 can receive a mechanical attachment (e.g., a bolt, screw, pin, tie, etc.) with which to couple the retention bracket 220 to plate 216. The body portion 226 of the damper 218 is fastened to the face 264 of plate 216 by fasteners 228 and 258.

The placement of the retention bracket 220 (on plate 216) relative to the rack 212 may be based on the length of the teeth of in each of the damper gear and the rack. In this example, the teeth 224 on the gear have a length, D3. The teeth 230 on the rack 212 have a length, D2. In this example, D2 and D3 are substantially equal in length. In some embodiments, D2 and D3 are not substantially equal (e.g., one may be longer or shorter than the other). In addition, the bottom surface of rack 212 is separated from top surface 232 of retention bracket 220 by a distance D4. To maintain the engagement of the teeth 224 and the teeth 230, the distance D4 is less than the smaller of D2 and D3. When D4 is less than the smaller of D2 and D3 (or less than both D2 and D3), relative movement of the teeth 224 and the teeth 230 will not (completely) disengaged the teeth 224 and the teeth 230 from one another. Instead, when D4 is less than the smaller of D2 and D3, the movement of rack 212 or movement of plate 216 up by a distance equal to D4 (as limited by the retaining bracket) results in the teeth being only partially engaged with one other (but are still engaged).

Turning to FIGS. 5A and 5B, FIGS. 5A and 5B are simplified two-dimensional isometric views of another example configuration the damping apparatus. In the configuration as shown in FIGS. 5A and 5B (a second configuration), the at least one of the plurality of gear teeth 224 are partially engaged with the at least one tooth of teeth 230 on the rack 212 based on the retention bracket 238 contacting a surface of the rack 212. In addition, the rack is shown in a configuration where the drawer (e.g., via the chassis) is fully inserted into a storage system. Turning now to FIG. 5A, FIG. 5A illustrates a view of the damping apparatus as viewed perpendicular to the first surface 262 of plate 216. In transition from the configuration of FIGS. 4A-4B (a first configuration) to the configuration of FIGS. 5A-5B (a second configuration), the rotation of the plate 216 causes the spring 222 to shorten from length L1 to length L2. In the example illustrated in FIGS. 5A and 5B, the plate 216 has rotated (i.e., about opening 278) in a direction from C to C' by an angle .theta. (theta) with respect to a horizontal surface of wall 214 thereby causing the relative displacement between gear teeth 224 and teeth 230. As the plate rotates, it causes the damper 218 to rotate in a direction from E to E'. Because the plate has been rotated, the spring 222 is further compressed to a length L2, which is less than length L1 (i.e., the spring is more compressed (is shorter) than the state shown in FIGS. 4A and 4B). As mentioned above, the pin 246 is fixed with respect to wall 270 (e.g., by screw 426a and head 252). Thus, any additional compression in the spring results in a larger compression force being applied to hold the teeth 230 and gear teeth 224 in contact with one another. In this example, the teeth 230 and the gear teeth 224 are separated by a relative distance, D4, such that a bottom surface of rack 212 is in contact with a top surface 232 of retention bracket 220. The relative movement between the teeth 230 the gear teeth 224 (in this case, by a distance D4) does not cause disengagement of the teeth from one another. Instead, the teeth (i.e., teeth 230 and gear teeth 224) are partially engaged with one another (i.e., less than fully engaged) and remain in contact with one another. Because the teeth remain at least partially engaged with one another, the drawer to can be opened and/or closed while providing (or maintaining) damping to maintain safe operating speed of a drawer coupled to the system (e.g., an acceptable rate of acceleration/deceleration for the electrical content housed within the drawer).

In terms of the dimensions of the articles discussed herein any suitable specifications (e.g., length, width, depth (or height), opening space, etc.) may be used and can be based on particular end user needs, or specific elements to be addressed by the apparatus (or the system in which it resides). It is imperative to note that all of the specifications and relationships outlined herein (e.g., height, width, length, diameter, # of arms, etc.) have only been offered for purposes of example and teaching only. Each of these data may be varied considerably without departing from the spirit of the present disclosure, or the scope of the appended claims. The specifications apply only to one non-limiting example and, accordingly, should be construed as such. Along similar lines, the materials used in constructing the articles can be varied considerably, while remaining within the scope of the present disclosure. Various ferrous/alloy materials may be used, magnetic materials may be used, and polymers (e.g., heat resistant material) may be used in certain configurations of the present disclosure. Still other configurations may include certain integrations of these materials, which may be based on particular working needs.

In the above examples, a damping apparatus supports electrical devices (e.g., electrical components 202, electrical storage disks 108a-h, electrical storage disk and the server). It is noted that present disclosure is not limited to such examples. The damping apparatus, systems, and methods disclosed herein are applicable to any suitable component with moving parts that could potentially be damaged by motions such as movement, acceleration, deceleration, vibration, etc. (e.g., when such motions are rapid). For example, instead of (or in addition to) the electrical devices, the other components may include a purely mechanical device, a microscope, laboratory equipment, and the like.

Note that in this Specification, references to various features (e.g., elements, structures, modules, components, steps, operations, characteristics, procedures, etc.) included in 'one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Moreover, the elements described herein may be made of any suitable materials, including metal (e.g., stainless steel, copper, silver, platinum, brass, aluminum, etc.), plastic, wood, etc. or any suitable combination thereof. Each element may also be made of a combination of different materials (e.g., geared damper may have a metal body 233 and a plastic gear with gear teeth 224). Any suitable material or combination of materials may be used for the elements described herein without departing from the broad scope of the present disclosure.

Additionally, it should be noted that with the examples provided above, interaction may be described in terms of two, three, or four components. However, this has been done for purposes of clarity and example only. In certain cases, it may be easier to describe one or more of the functionalities of a given set of flows by only referencing a limited number of components (e.g., damped gear, rack, plate, spring, retaining bracket, spinning storage media). It should be appreciated that the systems described herein are readily scalable and, further, can accommodate a large number of components, as well as more complicated/sophisticated arrangements and configurations. Accordingly, the examples provided should not limit the scope or inhibit the broad techniques of using flexural elements for providing a seamless (e.g., unbroken) electrical signal between electrical components, as potentially applied to a myriad of other architectures.

It is also important to note that the procedures in the methods described herein illustrate only some of the possible scenarios that may be executed by, or within, an apparatus (e.g., a damping apparatus and/or system for providing motion damping) described herein. Some of these procedures may be deleted or removed where appropriate, or these procedures may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. The apparatus provides substantial flexibility in that any suitable arrangements, chronologies, configurations, and timing mechanisms may be provided without departing from the teachings of the present disclosure.

It should also be noted that many of the previous discussions may imply a single apparatus (e.g., damped gear, rack, plate, spring, retaining bracket, etc.). In reality, there is a multitude of apparatuses (and a multiple of damped gears and corresponding rack) in certain implementations of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An apparatus comprising:
   a plate operable to pivotally attach to a first wall of a drawer, the plate including a pivot point about which the plate is operable to pivot;
   a damped gear coupled to the plate, the damped gear having a plurality of gear teeth; and
   a spring to facilitate pivoting the plate about the pivot point to engage a retention bracket attached to the plate and operable to prevent disengagement of at least one of the plurality of gear teeth with at least one tooth on a rack.

2. The apparatus of claim 1,
   wherein,
      the spring facilitates pivoting the plate about the pivot point to engage the at least one of the plurality of gear teeth,
      the plate includes a flange to support the retention bracket, and
      the spring is compressed between a face of the flange and a retaining surface distal the face of the flange.

3. The apparatus of claim 2, further comprising:
   a pin coupled to a second wall of the drawer, the pin including a first end attached to the second wall of the drawer, a second end distal the first end and supporting the retaining surface, and a shaft disposed between the first end and the second end, the shaft extending through an opening in the flange, the second wall extending perpendicular to the first wall.

4. The apparatus of claim 2,
   wherein,
      the plate includes a first planar portion, a second planar portion, and a medial portion disposed between the first planar portion and the second planar portion,
      the first planar portion includes a pivot portion,
      the second planar portion is coupled to the damped gear, and
      the medial portion the flange.

5. The apparatus of claim 4,
   wherein,
      the first planar portion extends parallel to and is offset from the second planar portion, and
      the medial portion extends perpendicular to both the first planar portion and the second planar portion.

6. The apparatus of claim 1,
   wherein,
      the plate is operable to be positioned in at least a first configuration and a second configuration,
      in the first configuration, the at least one of the plurality of gear teeth are fully engaged with the at least one tooth on the rack, and
      in the second configuration, the at least one of the plurality of gear teeth are partially engaged with the at least one tooth on the rack based on the retention bracket contacting a surface of the rack.

7. The apparatus of claim 1, wherein the retention bracket is attached in a fixed position relative to the plate, the fixed position is to limit a vertical displacement of a bottom surface of the rack relative to a face of the retention bracket to be less than a particular distance.

8. The apparatus of claim 7, wherein the particular distance is a length of the at least one of the plurality of gear teeth or another length of the at least one tooth on the rack.

9. The apparatus of claim 1, wherein the damped gear is operable to damp movement of the rack.

10. The apparatus of claim 9, wherein damping the movement of the rack prevents physical damage to one or more electrical component stored within the drawer, the rack, and/or a chassis of the rack.

11. The apparatus of claim 10, wherein the one or more electrical component includes disk storage or a spinning storage media.

12. The apparatus of claim 1, wherein the spring facilitates pivoting to engage the at least one of the plurality of gear teeth with the at least one tooth on the rack during both withdrawal and insertion of the drawer.

13. The apparatus of claim 1,
   wherein,
      the damped gear is operable to damp sliding the rack in a first direction during withdrawal of the drawer, and
      the damped gear is operable to damp sliding the rack in a second direction during insertion of the drawer.

14. The apparatus of claim 1, wherein the plate is attached to the first wall with a hinge.

15. An apparatus comprising:
   a plate to pivotally attach to a wall of a drawer, the plate including a pivot point about which the plate is operable to pivot;

a damped gear coupled to the plate, the damped gear having a plurality of gear teeth; and a retention bracket attached to the plate and operable to prevent disengagement of at least one of the plurality of gear teeth with at least one tooth on a rack.

16. The apparatus of claim 15, further comprising:

a spring to facilitate pivoting the plate about the pivot point to engage the at least one of the plurality of gear teeth, wherein, the plate includes a flange to support the spring, and the spring is compressed between a face of the flange and a retaining surface distal the face of the flange.

17. The apparatus of claim 15, wherein, the plate is operable to be positioned in a third configuration, and in the third configuration, the at least one of the plurality of gear teeth are partially engaged with the at least one tooth on the rack based on the retention bracket contacting a surface of the rack.

18. The apparatus of claim 15, wherein the damped gear is to damp movement of the rack for preventing physical damage to one or more electrical component stored within the drawer, the rack, and/or a chassis of the rack.

19. The apparatus of claim 15, further comprising:

a spring to facilitate pivoting to engage the at least one of the plurality of gear teeth with the at least one tooth on the rack during both withdrawal and insertion of the drawer.

20. The apparatus of claim 15, wherein, the damped gear is operable to damp sliding the rack in a first direction during withdrawal of the drawer, and the damped gear is operable to damp sliding the rack in a second direction during insertion of the drawer.

* * * * *